US008730179B2

(12) United States Patent
Rosenblatt et al.

(10) Patent No.: US 8,730,179 B2
(45) Date of Patent: May 20, 2014

(54) INTEGRATED TOUCH SENSOR AND SOLAR ASSEMBLY

(75) Inventors: Michael Nathaniel Rosenblatt, Campbell, CA (US); Benjamin Lyon, San Jose, CA (US); John Benjamin Filson, San Jose, CA (US); Steve Porter Hotelling, San Jose, CA (US); Gordon Cameron, Ottawa (CA); Cameron Frazier, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 1092 days.

(21) Appl. No.: 12/242,706

(22) Filed: Sep. 30, 2008

(65) Prior Publication Data
US 2010/0079387 A1   Apr. 1, 2010

(51) Int. Cl.
*G06F 3/041*   (2006.01)

(52) U.S. Cl.
USPC ........ 345/173; 345/175; 345/176; 178/18.06; 178/18.09; 136/206; 136/244

(58) Field of Classification Search
USPC .......................... 345/156–184; 349/106, 116; 178/18.01–18.06; 136/243–246, 249, 136/251, 259; 138/259; 126/699
See application file for complete search history.

(56) References Cited

U.S. PATENT DOCUMENTS

| | | | |
|---|---|---|---|
| 4,310,839 A * | 1/1982 | Schwerdt ..................... 345/173 |
| 4,561,002 A * | 12/1985 | Chiu ............................ 341/26 |
| 4,687,885 A * | 8/1987 | Talmage et al. ............. 178/18.05 |
| 4,745,240 A * | 5/1988 | Furukawa et al. ......... 178/18.05 |
| 5,118,361 A * | 6/1992 | Fraas et al. ..................... 136/246 |
| 5,123,968 A * | 6/1992 | Fraas et al. ..................... 136/246 |
| 5,185,042 A * | 2/1993 | Ferguson ...................... 136/244 |
| 5,483,261 A | 1/1996 | Yasutake |
| 5,488,204 A | 1/1996 | Mead et al. |
| 5,708,460 A * | 1/1998 | Young et al. .................. 345/173 |
| 5,825,352 A | 10/1998 | Bisset et al. |
| 5,835,079 A | 11/1998 | Shieh |

(Continued)

FOREIGN PATENT DOCUMENTS

| | | |
|---|---|---|
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Alexander Eisen
*Assistant Examiner* — Sanjiv D Patel
(74) *Attorney, Agent, or Firm* — Morrison & Foerster LLP

(57) ABSTRACT

Integrated touch sensor and solar panel stack-up configurations that may be used on portable devices, particularly handheld portable devices such as a media player or phone are disclosed. The solar cell stack-up configurations may include one or more touch sensor layers and one or more solar cell layers. By integrating both the touch sensors and the solar cell layers into the same stack-up, surface area on the portable device may be conserved. The solar panel may be mounted face down or otherwise obstructed by a touch sensor or other component. In this configuration, the device may include light channels that allow light into the device and direct the light around the component and to the solar panel. A parabolic reflector may be used to direct the light.

10 Claims, 14 Drawing Sheets

(56) References Cited

U.S. PATENT DOCUMENTS

| | | | |
|---|---|---|---|
| 5,880,411 A | 3/1999 | Gillespie et al. | |
| 6,188,391 B1* | 2/2001 | Seely et al. | 345/173 |
| 6,295,818 B1* | 10/2001 | Ansley et al. | 60/641.8 |
| 6,310,610 B1 | 10/2001 | Beaton et al. | |
| 6,310,614 B1* | 10/2001 | Maeda et al. | 345/173 |
| 6,323,846 B1 | 11/2001 | Westerman et al. | |
| 6,380,930 B1* | 4/2002 | Van Ruymbeke | 345/173 |
| 6,452,088 B1* | 9/2002 | Schmidt | 136/244 |
| 6,655,581 B1* | 12/2003 | Takishima et al. | 235/379 |
| 6,690,387 B2 | 2/2004 | Zimmerman et al. | |
| 6,967,700 B2* | 11/2005 | Wang et al. | 349/116 |
| 7,015,894 B2 | 3/2006 | Morohoshi | |
| 7,030,860 B1* | 4/2006 | Hsu et al. | 345/173 |
| 7,184,064 B2 | 2/2007 | Zimmerman et al. | |
| 7,206,044 B2* | 4/2007 | Li et al. | 349/113 |
| 7,339,636 B2 | 3/2008 | Voloschenko et al. | |
| 7,663,607 B2 | 2/2010 | Hotelling et al. | |
| 7,807,920 B2* | 10/2010 | Linke et al. | 136/246 |
| 7,843,411 B2* | 11/2010 | Manning | 345/87 |
| 7,872,442 B2* | 1/2011 | Liang et al. | 320/101 |
| 8,368,654 B2* | 2/2013 | Rosenblatt et al. | 345/173 |
| 8,479,122 B2 | 7/2013 | Hotelling et al. | |
| 2003/0081158 A1* | 5/2003 | Li et al. | 349/113 |
| 2004/0017524 A1* | 1/2004 | Li | 349/106 |
| 2004/0084077 A1* | 5/2004 | Aylaian | 136/246 |
| 2006/0026521 A1 | 2/2006 | Hotelling et al. | |
| 2006/0097991 A1* | 5/2006 | Hotelling et al. | 345/173 |
| 2006/0101685 A1* | 5/2006 | Smith et al. | 40/556 |
| 2006/0197753 A1 | 9/2006 | Hotelling | |
| 2006/0231133 A1* | 10/2006 | Fork et al. | 136/246 |
| 2007/0008299 A1* | 1/2007 | Hristov | 345/173 |
| 2007/0132740 A1* | 6/2007 | Meiby | 345/173 |
| 2008/0047605 A1* | 2/2008 | Benitez et al. | 136/259 |
| 2008/0094025 A1* | 4/2008 | Rosenblatt et al. | 320/101 |
| 2008/0110067 A1* | 5/2008 | Smith et al. | 40/541 |
| 2008/0271776 A1* | 11/2008 | Morgan | 136/246 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

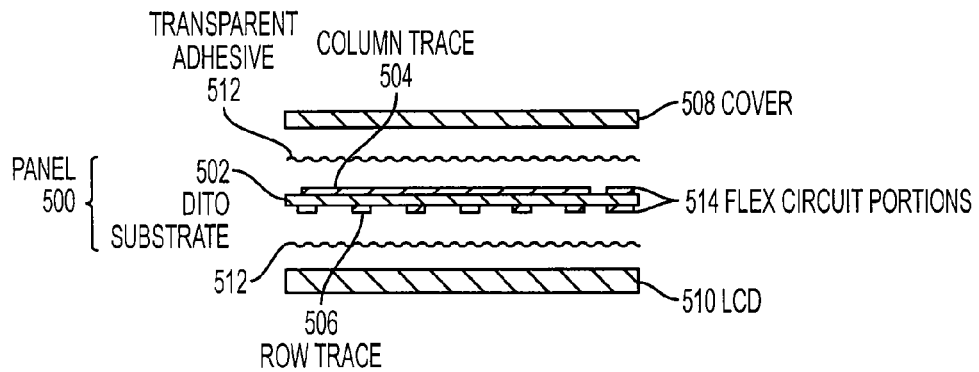
FIG. 5
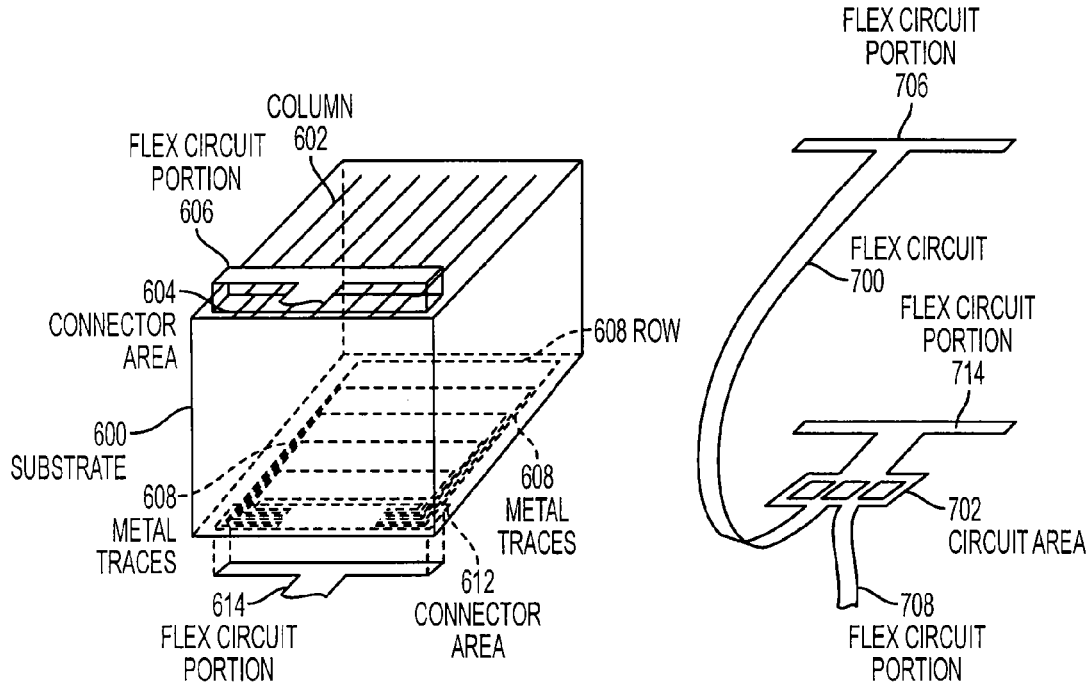
FIG. 6
FIG. 7

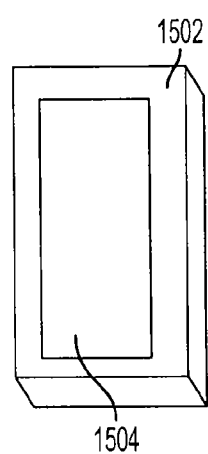
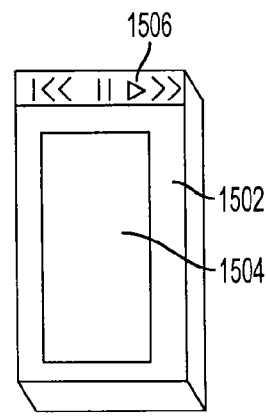
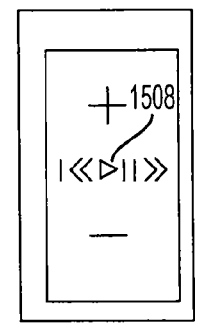
FIG. 15A     FIG. 15B     FIG. 15C
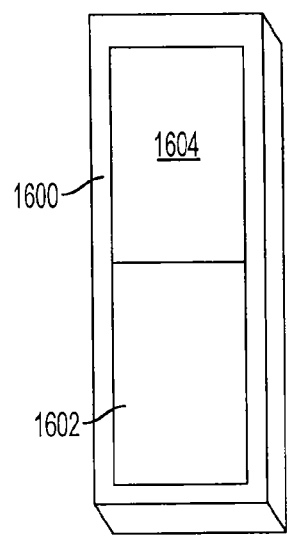
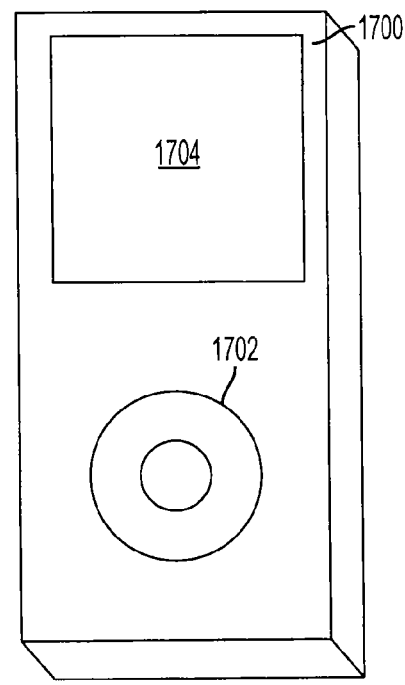
FIG. 16     FIG. 17

INTEGRATED TOUCH SENSOR AND SOLAR ASSEMBLY

FIELD OF THE INVENTION

This invention relates to touch sensors and solar cells, and more particularly, to integrated touch sensor array and solar cell stack-ups.

BACKGROUND OF THE INVENTION

Many types of input devices are presently available for performing operations in a computing system, such as buttons or keys, mice, trackballs, touch panels, joysticks, touch screens and the like. Touch screens, in particular, are becoming increasingly popular because of their ease and versatility of operation as well as their declining price. Touch screens can include a touch panel, which can be a clear panel with a touch-sensitive surface. The touch panel can be positioned in front of a display screen so that the touch-sensitive surface covers the viewable area of the display screen. Touch screens can allow a user to make selections and move a cursor by simply touching the display screen via a finger or stylus. In general, the touch screen can recognize the touch and position of the touch on the display screen, and the computing system can interpret the touch and thereafter perform an action based on the touch event (the touching of fingers or other objects upon a touch-sensitive surface).

Touch panels can include an array of touch sensors capable of detecting touch events. Some touch panels may be able to detect multiple touches (the touching of fingers or other objects upon a touch-sensitive surface at distinct locations at about the same time) and near touches (fingers or other objects within the near-field detection capabilities of their touch sensors), and identify and track their locations. Examples of multi-touch panels are described in Applicant's co-pending U.S. application Ser. No. 10/842,862 entitled "Multipoint Touchscreen," filed on May 6, 2004 and published as U.S. Published Application No. 2006/0097991 on May 11, 2006, the contents of which are incorporated by reference herein.

Virtually all portable devices rely on electrical power in one form or another. Some of them rely on various types of batteries which store energy in chemical forms. Some batteries are disposable and they produce only a certain fixed amount of electrical power from the stored energy. Some batteries, such as nickel-cadmium NiMH (Nickel Metal Hydride) or lithium-ion batteries, may be recharged, but they also generate only a finite amount of electrical energy between recharges. For devices such as portable music players, when they are in continual use, they can be used for about 10 or 20 hours, or often much less, before their batteries need to be replaced or recharged.

Using solar cells on portable devices, particularly handheld portable devices with small form factors, however, poses certain technical and/or design problems. For example, the small size of the portable device means there is a small surface area which can be used for placing solar cells. This surface area is typically further reduced by other components that appear on the surfaces of the devices such as input devices and display devices. Since the maximum solar energy that can be produced from a solar panel is roughly proportional to the surface area of the solar cells, this reduces the amount of solar energy that may be gained from the solar panel.

FIG. 1 shows a handheld calculator 102 with a built-in solar cell 104. The solar cell or solar panel 104 is embedded on the front of the device. The calculator includes a display 106 and an area for user input, which comprises multiple keys 108. It should be noted that the upper area of the device used for the solar panel could have been used for other purposes, for example, for a bigger display or input area. Alternatively, the overall size of the device could have been reduced were it not for the solar panel.

SUMMARY OF THE INVENTION

This relates to integrated touch sensor and solar panel stack-up configurations that may be used on portable devices, particularly handheld portable devices such as a media player or phone. The stack-up configurations may include one or more touch sensor layers and one or more solar cell layers. By integrating both the touch sensors and the solar cell layers into the same stack-up, surface area on the portable device may be conserved.

An integrated touch sensor and solar panel may be fabricated using a transparent double-sided ITO (DITO) substrate stacked on a solar cell panel. The DITO substrate may be made out of any transparent material, for example, clear glass, plastic, hybrid glass/plastic materials, and the like. The solar cell panel may include collectors on a first side and electrodes on the side opposite the side adhered to the DITO substrate.

To connect to column and row traces on the DITO substrate, flex circuit portions may be bonded to opposing sides at the same edge of DITO substrate, although other bonding locations may also be employed. In some embodiments, a single flex may be use for routing both the touch sensor and solar cell panel.

The integrated touch sensor and solar panel assembly may also be fabricated using a single layer ITO (SITO) substrate and including a solar cell panel. The SITO substrate may be made out of any transparent material. The SITO substrate 1100 may include a single layer electrode pattern on either side of the substrate that includes both drive lines and sense lines formed adjacent to or near each other on the same single layer of the substrate. The solar cell panel may include collectors on a first side and electrodes on the opposite side. A touch flex circuit may be bonded to an edge of SITO substrate, although other bonding locations may also be employed. Similarly, a solar flex may be used to route power from the solar cell panel. The touch flex and the solar flex may be one and the same.

A flexible touch sensor and solar panel configuration may be formed by using a flexible single layer ITO (SITO) substrate and including a flexible polymer solar cell panel. The SITO substrate may be made out of any transparent flexible material, for example, polyamide or other plastic.

The solar panel may be mounted face down or otherwise obstructed by a touch sensor or other component. In this configuration, the device may include light channels that allow light into the device and direct the light around the component and to the solar panel. A parabolic reflector may be used to direct the light.

BRIEF DESCRIPTION OF THE DRAWINGS

FIG. 5 illustrates an exemplary capacitive touch sensor panel fabricated using a double-sided ITO (DITO) substrate having column and row ITO traces formed on either side of the substrate, and bonded between a cover and a LCD using transparent adhesive according to some embodiments of this invention.

FIG. 6 is an exploded perspective view of an exemplary DITO substrate (with its thickness greatly exaggerated for purposes of illustration only) with columns and rows formed on either side according to some embodiments of this invention.

FIG. 7 illustrates an exemplary flex circuit according to some embodiments of this invention, including flex circuit portions for connecting to the row and column traces, respectively, on either side of a DITO substrate, and a flex circuit portion for connecting to a host processor.

FIG. 15a illustrates an exemplary handheld media player including an integrated touch sensor solar cell panel surface.

FIG. 15b illustrates an exemplary handheld media player including an integrated touch sensor solar cell panel surface and LED indicators on a front surface of the handheld media player.

FIG. 15c illustrates an exemplary handheld media player including an integrated touch sensor solar cell panel surface and embossed icons on a front surface of the handheld media player.

FIG. 16 illustrates an exemplary handheld media player including an integrated touch sensor solar cell panel surface and an integrated touch sensor LCD display surface on a front surface of the handheld media player.

FIG. 17 illustrates an exemplary handheld media player including an integrated touch sensor solar cell panel surface and a LCD display surface on a front surface of the handheld media player.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Described are integrated touch sensor and solar panel stack-up configurations that may be used on portable devices, particularly handheld portable devices such as a media player or phone. The stack-up configurations may include one or more touch sensor layers and one or more solar cell layers. By integrating both the touch sensors and the solar cell layers into the same stack-up, surface area on the portable device may be conserved.

Figure 1:
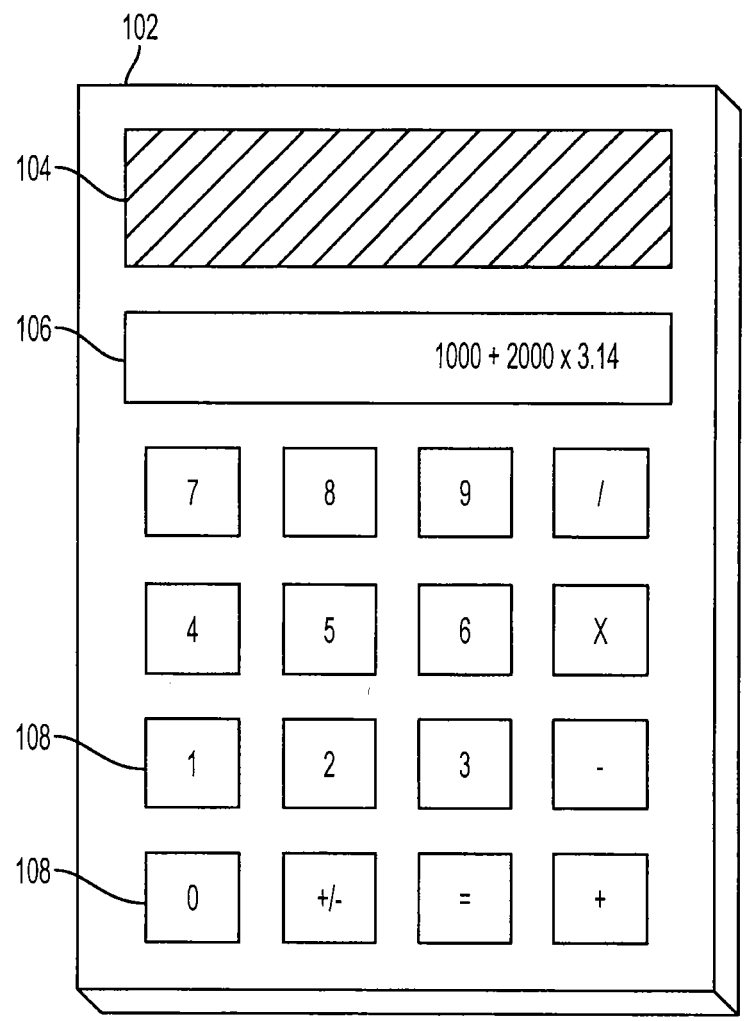
FIG. 1 shows a prior art handheld calculator with a built-in solar cell on the front.
Figure 2:
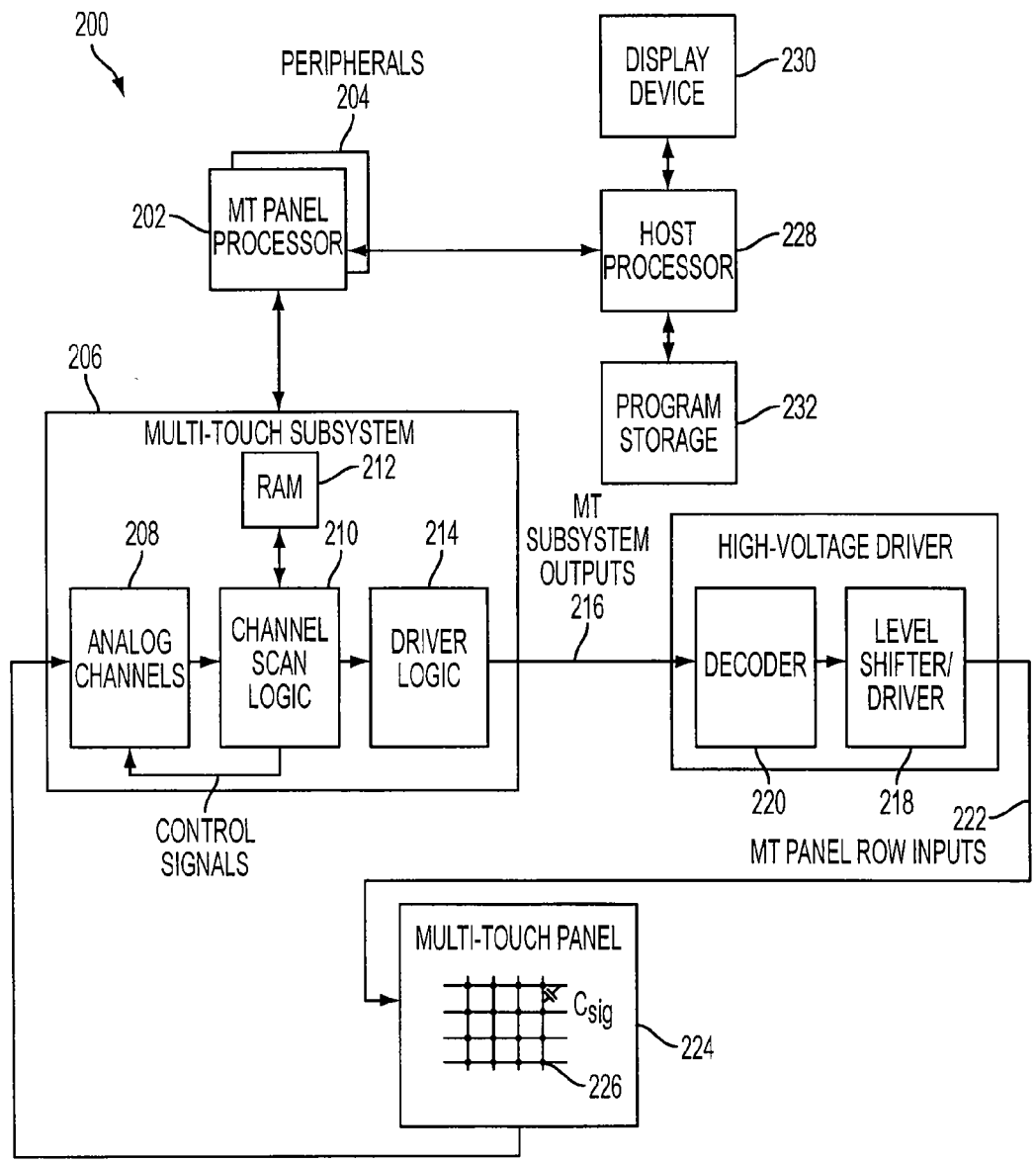
FIG. 2 illustrates an exemplary computing system operable with a capacitive multi-touch sensor panel according to some embodiments of this invention.

Multi-touch sensor panels and their associated touch sensor panel circuitry may be able to detect multiple touches (touch events or contact points) that occur at about the same time, and identify and track their locations. FIG. 2 illustrates exemplary computing system 200 operable with capacitive multi-touch sensor panel 224 according to embodiments of this invention. Multi-touch sensor panel 224 can be created using a substrate with column and row traces formed on either side of the substrate using a novel fabrication process. Flex circuits can be used to connect the column and row traces on either side of the touch sensor panel to its associated touch sensor panel circuitry. Traces made of copper or other highly conductive metals running along the edge of the substrate can be used to bring the row traces to the same edge of the substrate as the column traces so that the flex circuits may be bonded to the same edge of the substrate on opposing sides of the substrate, minimizing the area needed for connectivity and reducing the overall size of the touch sensor panel. A single flex circuit can be fabricated to connect to the rows and columns on opposing sides at the same edge of the substrate. Furthermore, the row traces can be widened to shield the column traces from a modulated Vcom layer.

Computing system 200 can include one or more panel processors 202 and peripherals 204, and panel subsystem 206. The one or more processors 202 can include, for example, an ARM968 processor or other processors with similar functionality and capabilities. However, in other embodiments, the panel processor functionality can be implemented instead by dedicated logic such as a state machine. Peripherals 204 can include, but are not limited to, random access memory (RAM) or other types of memory or storage, watchdog timers and the like.

Panel subsystem 206 can include, but is not limited to, one or more analog channels 208, channel scan logic 210 and driver logic 214. Channel scan logic 210 can access RAM 112, autonomously read data from the analog channels and provide control for the analog channels. This control can include multiplexing columns of multi-touch panel 224 to analog channels 208. In addition, channel scan logic 210 can control the driver logic 214 and stimulation signals being selectively applied to rows of multi-touch panel 224. In some embodiments, panel subsystem 206, panel processor 202 and peripherals 204 can be integrated into a single application specific integrated circuit (ASIC).

Driver logic 214 can provide multiple panel subsystem outputs 216 and can present a proprietary interface that drives the high voltage driver, which is comprised of decoder 220 and subsequent level shifter and driver stage 218, although level-shifting functions could be performed before decoder functions. Level shifter and driver 218 can provide level shifting from a low voltage level (e.g. CMOS levels) to a higher voltage level, providing a better signal-to-noise (S/N) ratio for noise reduction purposes. Decoder 220 can decode the drive interface signals to one out of N outputs, whereas N is the maximum number of rows in the panel. Decoder 220 can be used to, reduce the number of drive lines needed between the high voltage driver and panel 224. Each panel row input 222 can drive one or more rows in panel 224. In some embodiments, driver 218 and decoder 220 can be integrated into a single ASIC. However, in other embodiments, driver 218 and decoder 220 can be integrated into driver logic 214, and in still other embodiments, driver 218 and decoder 220 can be eliminated entirely.

Computing system 200 can also include host processor 228 for receiving outputs from panel processor 202 and performing actions based on the outputs that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to panel processing, and can be coupled to program storage 232 and display device 230 such as a liquid crystal display (LCD) for providing a UI to a user of the device.

As mentioned above, multi-touch panel 224 can in some embodiments include a capacitive sensing medium having a plurality of row traces or driving lines and a plurality of column traces or sensing lines (although other sensing media may also be used) separated by a dielectric. Alternatively, the drive lines and sense lines can be formed adjacent to or near each other on the same layer on a single side of a substrate.

In some embodiments, the dielectric material that separates the column traces and sense traces can be transparent, such as glass, or can be formed from other materials such as Mylar, Polyimide, and other PCB materials. The row and column traces can be formed from a transparent conductive medium such as indium tin oxide (ITO) or antimony tin oxide (ATO), although other transparent or non-transparent materials such as copper or conductive ink can also be used. In some embodiments, the row and column traces can be perpendicular to each other, although in other embodiments other non-orthogonal and non-Cartesian orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis," as may be used herein are intended to encompass not only orthogonal grids, but the intersecting traces of other geometric configurations having first and second dimensions (e.g. the concentric and radial lines of a polar-coordinate arrangement).

At the "intersections" of the traces, where the traces pass above and below each other (but do not make direct electrical contact with each other), the traces essentially form two electrodes (although more than two traces could intersect as well). Each intersection of row and column traces can represent a capacitive sensing node and can be viewed as picture element (pixel) 226, which can be particularly useful when multi-touch panel 224 is viewed as capturing an "image" of touch. (In other words, after multi-touch subsystem 206 has determined whether a touch event has been detected at each touch sensor in the multi-touch panel, the pattern of touch sensors in the multi-touch panel at which a touch event occurred can be viewed as an "image" of touch (e.g. a pattern of fingers touching the panel).) The capacitance between row and column electrodes appears as a stray capacitance on all columns when the given row is held at DC and as a mutual capacitance Csig when the given row is stimulated with an AC signal. The presence of a finger or other object near or on the multi-touch panel can be detected by measuring changes to Csig. The columns of multi-touch panel 224 can drive one or more analog channels 208 (also referred to herein as event detection and demodulation circuits) in multi-touch subsystem 206. In some embodiments, each column is coupled to one dedicated analog channel 208. However, in other embodiments, the columns may be couplable via an analog switch to a fewer number of analog channels 208.

Figure 3A:
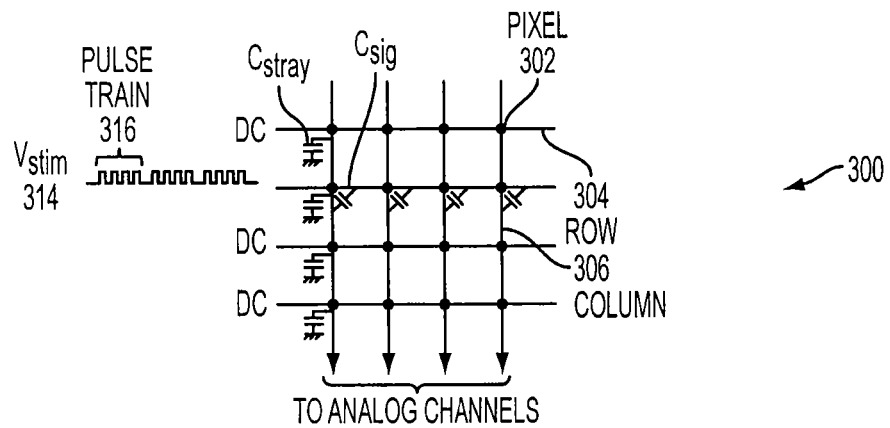
FIG. 3a illustrates an exemplary capacitive multi-touch panel according to some embodiments of this invention.

FIG. 3a illustrates exemplary capacitive multi-touch panel 300. FIG. 3a indicates the presence of a stray capacitance Cstray at each pixel 302 located at the intersection of a row 304 and a column 306 trace (although Cstray for only one column is illustrated in FIG. 2 for purposes of simplifying the figure). Note that although FIG. 3a illustrates rows 304 and columns 306 as being substantially perpendicular, they need not be so aligned, as described above. In the example of FIG. 3a, AC stimulus Vstim 314 is being applied to one row, with all other rows connected to DC. The stimulus causes a charge to be injected into the column electrodes through mutual capacitance at the intersecting points. This charge is Qsig=Csig×Vstm. Each of columns 306 may be selectively connectable to one or more analog channels (see analog channels 208 in FIG. 2).

Figure 3B:
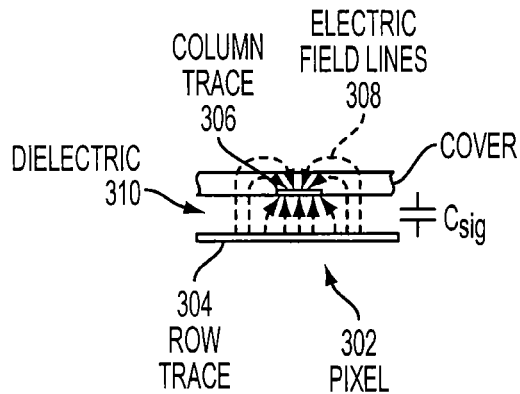
FIG. 3b is a side view of exemplary pixel in a steady-state (no-touch) condition according to some embodiments of this invention.

FIG. 3b is a side view of exemplary pixel 302 in a steady-state (no-touch) condition. In FIG. 3b, an electric field of electric field lines 308 of the mutual capacitance between column 306 and row 304 traces, or electrodes separated by dielectric 310, is shown.

Figure 3C:
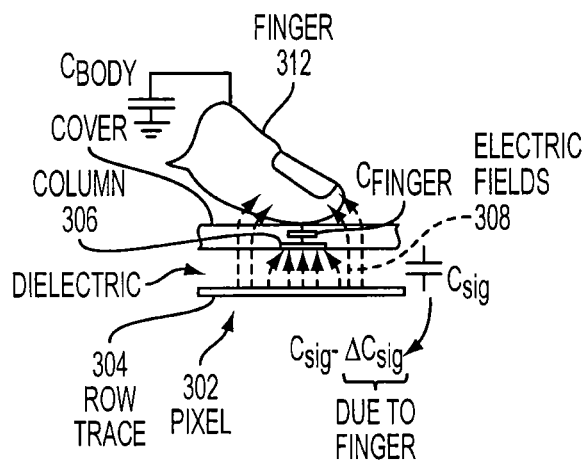
FIG. 3c is a side view of exemplary pixel in a dynamic (touch) condition according to some embodiments of this invention.

FIG. 3c is a side view of exemplary pixel 302 in a dynamic (touch) condition. In FIG. 3c, finger 312 has been placed near pixel 302. Finger 312 is a low-impedance object at signal frequencies, and has an AC capacitance Cfinger from the column trace 304 to the body. The body has a self-capacitance to ground Cbody of about 200 pF, where Cbody is much larger than Cfinger. If finger 312 blocks some electric field lines 308 between the row and column electrodes (those fringing fields that exit the dielectric and pass through the air above the row electrode), those electric field lines are shunted to ground through the capacitance path inherent in the finger and the body, and as a result, the steady state signal capacitance Csig is reduced by ΔCsig. In other words, the combined body and finger capacitance act to reduce Csig by an amount ΔCsig (which can also be referred to herein as Csig_sense), and can act as a shunt or dynamic return path to ground, blocking some of the electric fields as resulting in a reduced net signal capacitance. The signal capacitance at the pixel becomes Csig-ΔCsig, where Csig represents the static (no touch) component and ΔCsig represents the dynamic (touch) component. Note that Csig-ΔCsig may always be nonzero due to the inability of a finger, palm or other object to block all electric fields, especially those electric fields that remain entirely within the dielectric material. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e. a range from "no-touch" to "full-touch").

Referring again to FIG. 3a, as mentioned above, Vstim signal 314 can be applied to a row in multi-touch panel 300 so that a change in signal capacitance can be detected when a finger, palm or other object is present. Vstim signal 314 can be generated as one or more pulse trains 316 at a particular frequency, with each pulse train including a number of pulses. Although pulse trains 316 are shown as square waves, other waveshapes such as sine waves can also be employed. A plurality of pulse trains 316 at different frequencies can be transmitted for noise reduction purposes to detect and avoid noisy frequencies. Vstim signal 314 essentially injects a charge into the row, and can be applied to one row of multi-touch panel 300 at a time while all other rows are held at a DC level. However, in other embodiments, the multi-touch panel can be divided into two or more sections, with Vstim signal 314 being simultaneously applied to one row in each section and all other rows in that region section held at a DC voltage.

Each analog channel coupled to a column measures the mutual capacitance formed between that column and the row. This mutual capacitance is comprised of the signal capacitance Csig and any change Csig_sense in that signal capacitance due to the presence of a finger, palm or other body part or object. These column values provided by the analog channels may be provided in parallel while a single row is being stimulated, or may be provided in series. If all of the values representing the signal capacitances for the columns have been obtained, another row in multi-touch panel 300 can be stimulated with all others held at a DC voltage, and the column signal capacitance measurements can be repeated. Eventually, if Vstim has been applied to all rows, and the signal capacitance values for all columns in all rows have been captured (i.e. the entire multi-touch panel 300 has been "scanned"), a "snapshot" of all pixel values can be obtained for the entire multi-touch panel 300. This snapshot data can be initially saved in the multi-touch subsystem, and later transferred out for interpretation by other devices in the computing system such as the host processor. As multiple snapshots are obtained, saved and interpreted by the computing system, it is possible for multiple touches to be detected, tracked, and used to perform other functions.

As described above, because the rows may be either stimulated with an AC signal or held at a DC voltage level, and because the columns need to be connected to analog channels so that modulated output signals can be detected, demodulated and converted to output values, electrical connections must be formed with the rows and columns on either side of the dielectric of the touch sensor panel.

Figure 4:
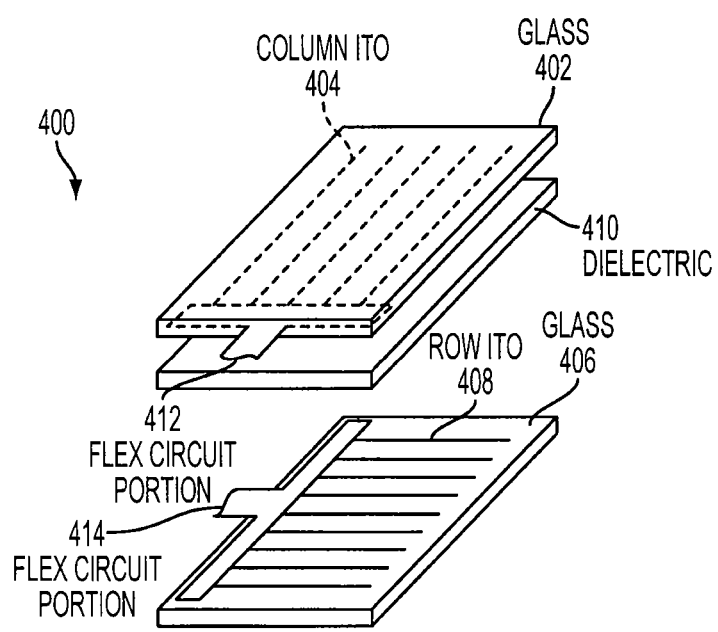
FIG. 4 is an exploded perspective view of an exemplary capacitive touch sensor panel formed from a top layer of glass upon which transparent column traces of ITO have been etched, and a bottom layer of glass upon which row traces of ITO have been etched.

FIG. 4 is an exploded perspective view of an exemplary capacitive touch sensor panel 400 formed from a top layer of glass 402 upon which transparent column traces of ITO 404 have been etched, and a bottom layer of glass 406 upon which row traces of ITO 408 have been etched. The top and bottom glass layers 402 and 406 are separated by a clear polymer spacer 410 that acts as a dielectric between the row and column traces. Because the rows and columns are perpendicular to each other, the most straightforward way to connect these rows and columns is to bond flex circuit 412 at one edge of the touch sensor panel, and bond another flex circuit 414 on an adjacent edge of the touch sensor panel. However, because the connection areas for these flex circuits 412 and 414 are not on the same edge of touch sensor panel 400 and are not on opposing sides of dielectric 410, the touch sensor panel must be made larger to accommodate these two non-overlapping connection areas.

Capacitive touch sensor panels typically form the row and column traces on two pieces of glass as shown in FIG. 4 because it has not been practical to form column and row traces on either side of a single substrate. Conventional methods for forming ITO traces on one side of a substrate require that the substrate be placed on rollers during the fabrication process. However, if the substrate is then flipped over to form ITO traces on the second side, the rollers will damage any traces previously formed on the first side of the substrate. Furthermore, when etching is used to etch away part of the ITO to form traces on one side of the substrate, the entire substrate is conventionally placed in an etching bath, which will etch away any traces previously formed on the other side of the substrate.

FIG. 5 illustrates an exemplary capacitive touch sensor panel 500 fabricated using a double-sided ITO (DITO) substrate 502 having column and row ITO traces 504 and 506, respectively, formed on either side of the substrate, and bonded between cover 508 and LCD 510 using transparent adhesive 512 according to embodiments of this invention. Substrate 502 can be formed from glass, plastic, hybrid glass/plastic materials, and the like. Cover 508 can be formed from glass, acrylic, sapphire, and the like. To connect to column and row traces 504 and 506, respectively, two flex circuit portions 514 can be bonded to opposing sides at the same edge of DITO 502, although other bonding locations may also be employed.

FIG. 6 is an exploded perspective view of an exemplary DITO substrate 600 (with its thickness greatly exaggerated for purposes of illustration only) with columns 602 and rows 608 formed on either side according to embodiments of this invention. Some of column ITO traces 602 on the top side are routed to a necked-down connector area 604, where they are brought off the panel by a flex circuit portion 606 that can be conductively bonded to the top of DITO substrate 600. In some embodiments, row ITO traces 608 on the bottom side can be connected to thin metal traces 610 that run alongside the edges of the bottom side. Metal traces 610 can be routed to connector area 612, which can be opposing connector area 604, or at least on the same edge of DITO substrate 600 as connector area 604. Providing connector areas 604 and 612 at the same edge of DITO substrate 600 can allow the substrate and therefore the product to be smaller. Another flex circuit portion 614 can be used to bring row ITO traces 608 off the panel.

Column and row ITO traces 602 and 608 can be formed on both sides of DITO substrate 600 using several fabrication methods. In one embodiment, a substrate can be placed on the rollers of the fabrication machinery and a layer of ITO can be sputtered onto a first side of DITO substrate 600 and etched (e.g. using photolithography techniques) to form column traces 602. A protective coating of photoresist (e.g. two layers of photoresist) can then be applied over the column traces 602, and DITO substrate 600 can be flipped over so that the rollers make contact only with the applied photoresist on the first side and not the formed column traces. Another layer of ITO can then be sputtered onto the now-exposed back side of DITO substrate 600 and etched to form row traces 608.

If no metal traces 610 are required, the photoresist on the first side can be stripped off to complete the process. However, if metal traces 610 are required at the edges to connect to row traces 608 and bring them to a particular edge of the substrate, a protective coating of photoresist (e.g. two layers of photoresist) can be applied over row traces 608, leaving the edges exposed. A metal layer can then be sputtered over the photoresist and exposed edges, and the metal layer can then be etched to form metal traces 610 at the edges. Finally, all remaining layers of photoresist can be stripped off.

Minor variations to the process described above can also be made. For example, the second side of the DITO substrate patterning may be formed by first patterning a photoresist using very simple geometry to cover only the interior region of the second side of the DITO substrate while leaving the edge regions exposed. For this variation, metal is sputtered first and then the photoresist with simple geometry is then stripped off to leave metal in the edge regions only. Then the ITO is sputtered over the entire second side of the DITO substrate. A second photoresist is applied and patterned to form the mask for the electrode patterns. A series of etching steps is then used to form the electrode pattern in the topmost ITO layer and metal layer underneath. The first etching steps etches the ITO only, and the second etch steps etches the metal layer only which produces the desired electrode geometry.

FIG. 7 illustrates an exemplary flex circuit 700 according to embodiments of this invention, including flex circuit portions 706 and 714 for connecting to the row and column traces, respectively, on either side of a DITO substrate, and flex circuit portion 708 for connecting to a host processor. Flex circuit 700 includes a circuit area 702 upon which the multi-touch subsystem, multi-touch panel processor, the high voltage driver and decoder circuitry (see FIG. 2), an EEPROM and some essential small components such as bypass capacitors can be mounted and connected to save space. Circuit area 702 may be shielded by an EMI can (not shown) which encloses circuit area 702 using top and bottom shield portions. The bottom can may be adhered to a structure of the device to secure the circuit area. From this circuit area 702, flex circuit 700 may connect to the top of the DITO substrate via flex circuit portion 706, to the bottom of the DITO substrate via flex circuit portion 714, and to a host processor via flex circuit portion 708.

The present invention generally relates to various methods and systems for producing an integrated solar cells and touch sensor stack-up. The integrated solar cell and touch sensor stack-up may be utilized in portable devices such as PDAs, phones and media players. According to embodiments of the invention, the devices have rechargeable batteries. The integrated solar cell and touch sensor stack-up embedded into the device may then provide electrical power to charge the batteries. The power generated from the solar cell can also directly power the operations of the device. This is illustrated in FIG. 8.

Figure 8:
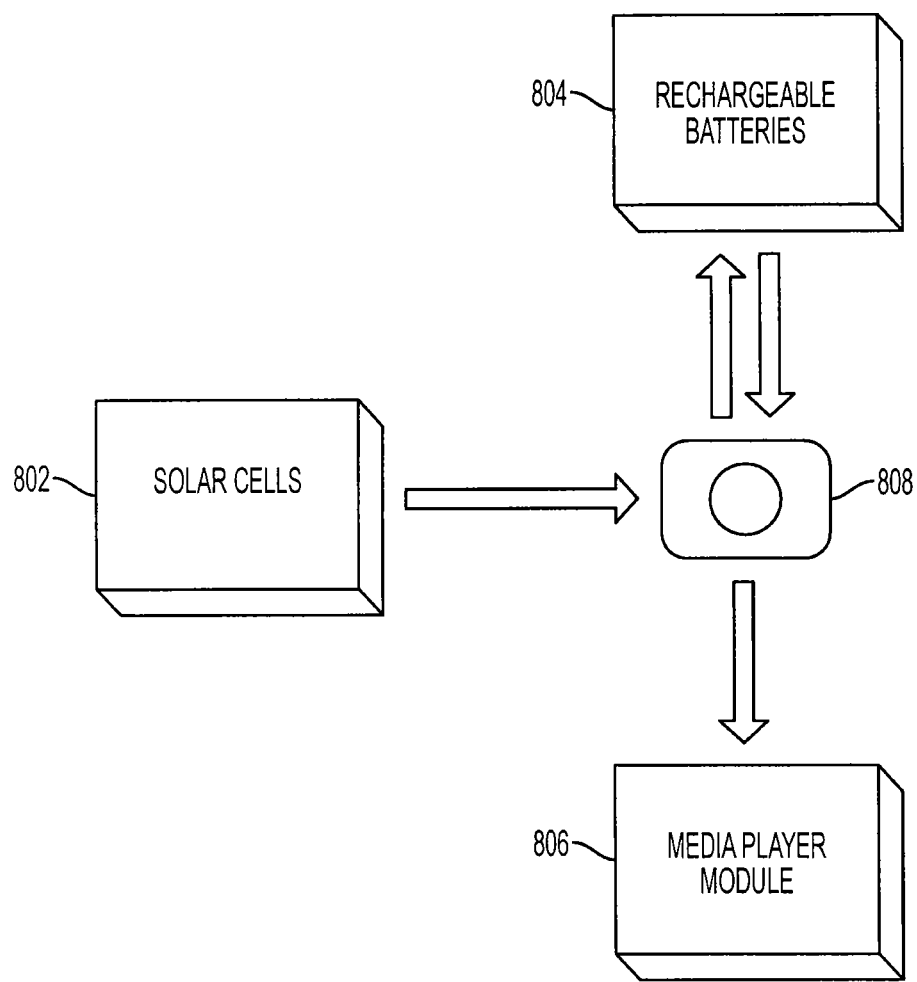
FIG. 8 is an exemplary block diagram illustrating various functional modules according to some embodiments this invention.

FIG. 8 depicts a block diagram illustrating various functional modules according to an embodiment of the present invention. It includes one or more solar cells 802, one or more rechargeable batteries 804 and a main operational module 806 of the device. In this example, the device's main function is assumed to be that of playing digital media such as music or video. The switch or gateway 808 is a schematic representation of a (virtual) unit responsible for the "traffic control" of the electricity flow in the device. This unit may or may not be a concrete unit including circuit elements. In some embodiments, this circuitry 808 may contain a boost converter to change the voltage coming from the solar cells 802 to a value suitable for the batteries 804 or the main unit 806. The arrows in the figure represent the possible flow of electricity. The electric power generated from the solar cells 802 can be used either to charge the rechargeable batteries 804 or to directly power the main module 806, or both. The main module can also be powered directly by the batteries 804 as indicated by the arrows. The rechargeable batteries can be charged by the solar cells 802 as well as external power sources (not shown in the figure).

Figure 9:
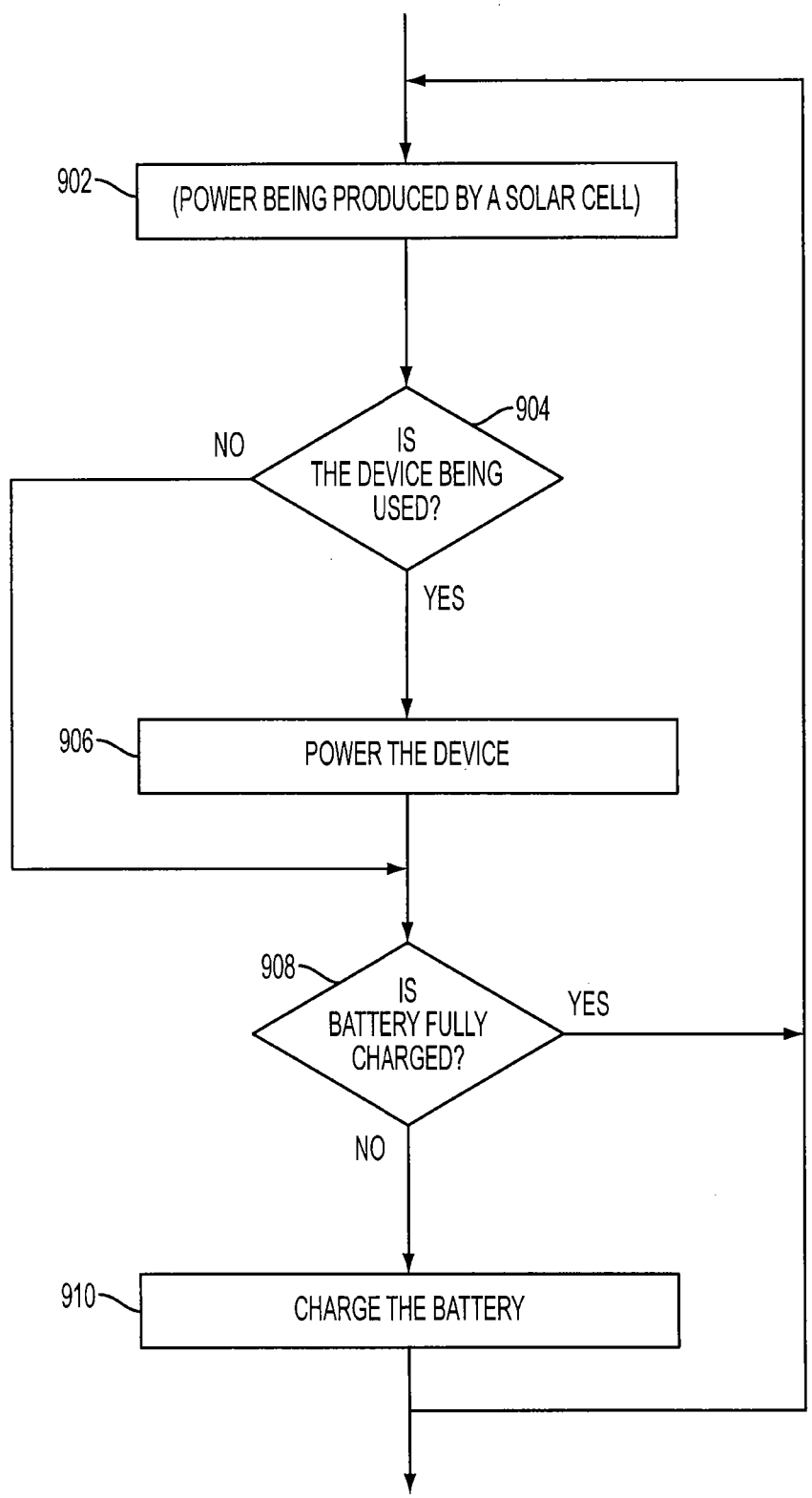
FIG. 9 is a flow chart illustrating an exemplary process for power management according to some embodiments of the invention.

FIG. 9 illustrates the flow of electricity in a device powered by solar cells according to an embodiment of the present invention. As with the "traffic control" unit 808 of FIG. 8, this flow chart may not represent any concrete process that needs to be implemented with extra circuitry. This chart may be viewed as an illustration of the internal process of the power flow in an exemplary device such as those depicted in FIG. 8. In some embodiments, however, this process may be implemented with explicit functional units, possibly with configurable options and/or with associated user interfaces. The exemplary process of FIG. 9 starts when the solar cells are exposed to bright light and the solar cells generate electricity as indicated in a block 902. When the device is being used, the instantaneous electric power generated from the solar cells may be used to directly power the device, at blocks 904 and 906. If not, following the No branch from block 904, the generated energy may be used to charge the batteries, at 910. Any leftover electricity after powering the device, 906, may also be used to charge the batteries. If the batteries are currently fully charged, the electric power generated from the solar cell will not be used, and the process returns to the beginning following the Yes branch at block 908. Otherwise, the generated solar energy is used to charge the batteries at 910. In cases where this process is implemented with additional functional units, the decision blocks such as 904 and 908 may be overridden by system settings and/or by user-provided options.

Figure 10:
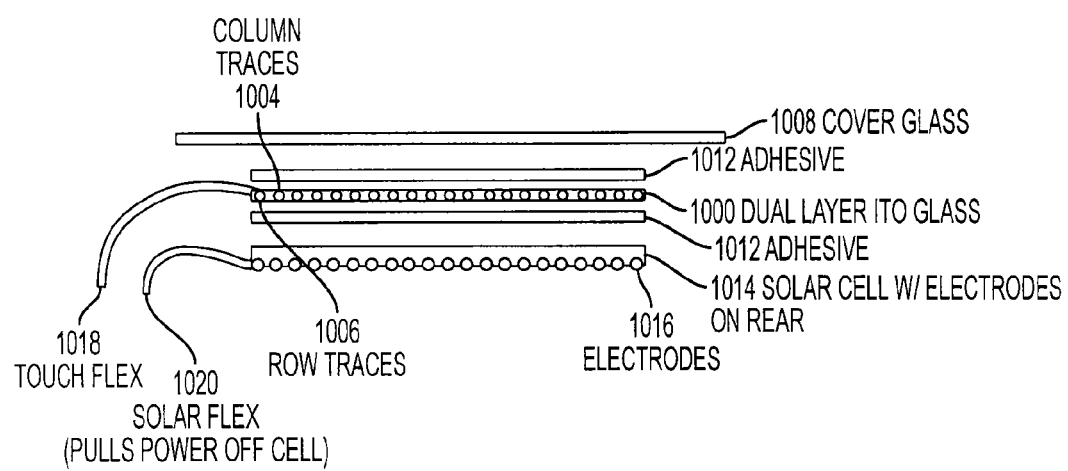
FIG. 10 is an exploded perspective view of an exemplary touch sensor panel fabricated using a double-sided ITO (DITO) substrate and including a solar cell panel.

FIG. 10 illustrates an exemplary capacitive touch sensor panel fabricated using a DITO substrate 1000 and including a solar cell panel 1014. The DITO substrate 1000 may be made out of any transparent material, for example, clear glass, plastic, hybrid glass/plastic materials, and the like. The DITO substrate 1000 may include column traces 1004 and row traces 1006 on either side of the substrate. The DITO substrate 1000 may be bonded between cover 1008 and solar cell panel 1014 using a transparent adhesive 1012. Cover 1008 may be formed from glass, acrylic, sapphire, and the like. The solar cell panel may include collectors on a first side and electrodes 1016 on the side opposite the side adhered to the DITO substrate 1000. To connect to column and row traces 1004 and 1006, respectively, two flex circuit portions 1018 may be bonded to opposing sides at the same edge of DITO substrate 1000, although other bonding locations may also be employed. Similarly, solar flex 1020 may be used to route power from the solar cell panel 1014.

In some embodiments, a single flex may be use for routing both the touch sensor and solar cell panel. The power management circuitry may operate independently of the touch circuitry. That is the ITO and touch circuitry may operate regardless of whether power is being generated by the solar cell. A reflective surface (e.g., a mirror) (not shown) may be affixed to the bottom of the solar cell panel 1014 (with transparent adhesive) to increase solar cell efficiency.

Figure 11:
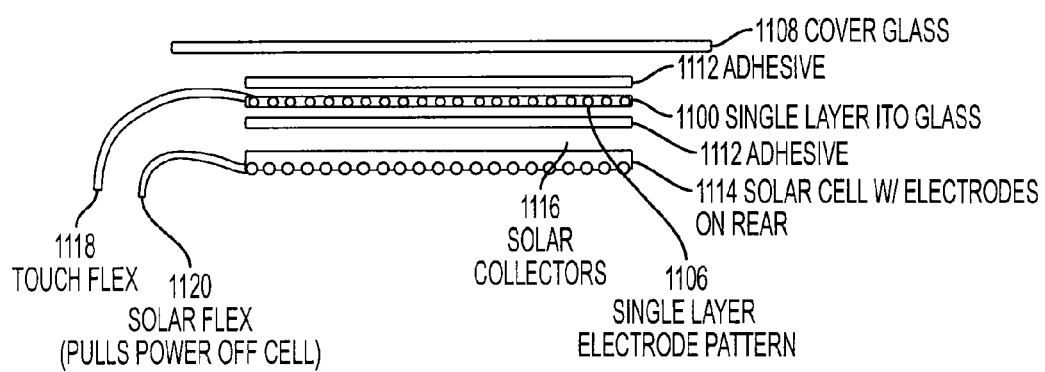
FIG. 11 is an exploded perspective view of an exemplary touch sensor panel fabricated using a single-sided ITO substrate and including a solar cell panel.

FIG. 11 illustrates an exemplary capacitive touch sensor panel using a single layer ITO (SITO) substrate 1100 and including a solar cell panel 1114. The SITO substrate may be made out of any transparent material, for example, clear glass, plastic, hybrid glass/plastic materials, and the like. The SITO substrate 1100 may include a single layer electrode pattern 1106 on either side of the substrate that includes both drive lines and sense lines formed adjacent to or near each other on the same single layer of the substrate. The SITO substrate 1100 may be bonded between cover 1108 and solar cell panel 1114 using a transparent adhesive 1112. Cover 1108 may be formed from glass, acrylic, sapphire, and the like. The solar cell panel may include collectors 1116 on a first side and electrodes 1106 on the opposite side. A touch flex circuit 1118 may be bonded to an edge of SITO substrate 1118, although other bonding locations may also be employed. Similarly, solar flex 1120 may be used to route power from the solar cell panel 1114.

Figure 12:
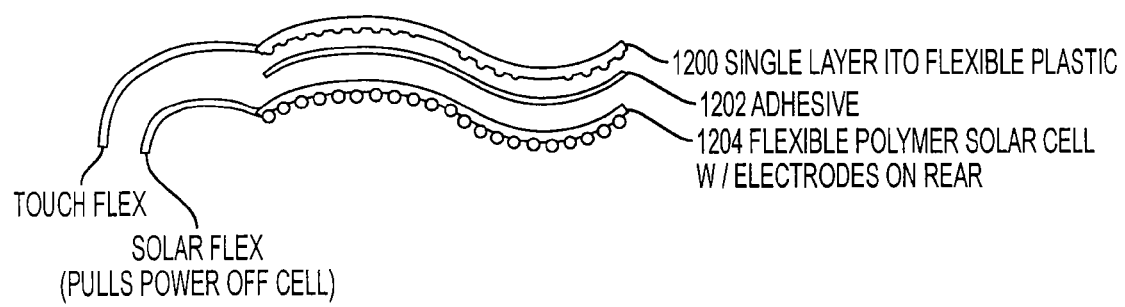
FIG. 12 is an exploded perspective view of an exemplary flexible touch sensor panel fabricated using a single-sided ITO substrate and including a solar cell panel.

FIG. 12 illustrates an exemplary flexible capacitive touch sensor panel using a flexible single layer ITO (SITO) substrate 1200 and including a flexible polymer solar cell panel 1204. The SITO substrate 1200 may be made out of any transparent flexible material, for example, polyamide or other plastic. The SITO substrate 1200 may be bonded to a flexible polymer solar cell panel 1204, such as those made from a conductive polymer such as polythiophene or p-phenylene vinylene ("PPV") derivatives, using a flexible transparent adhesive 1202.

Figure 13:
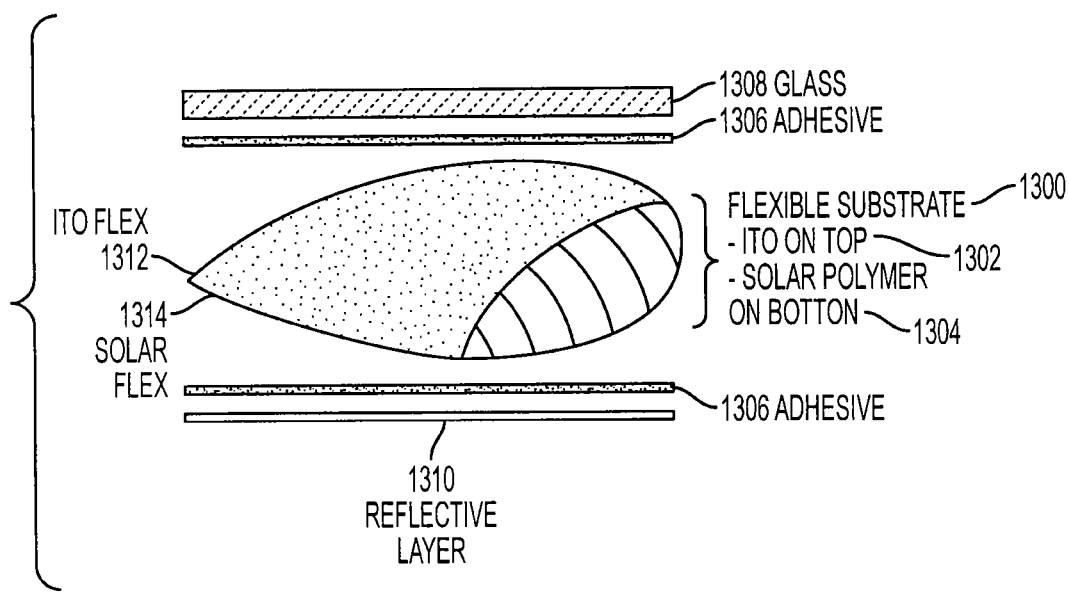
FIG. 13 is an exploded perspective view of an exemplary flexible touch sensor panel fabricated using a flexible substrate having touch sensor ITO on one side of the substrate and a solar slurry on second surface.

FIG. 13 illustrates an exemplary flexible touch sensor panel fabricated using a single flexible substrate 1300 for both the touch sensor and the solar panel. In FIG. 13, a flexible substrate 1300 has a touch sensor ITO pattern 1302 on one side of the substrate 1300 and a conductive solar polymer layer 1304 on a second surface. A transparent adhesive 1306 is used to attach the substrate 1300 to a cover glass 1308 and a reflective layer 1310. A touch flex 1312, and a solar flex 1314 may be bonded to one or more edges of the substrate 1300.

Figure 14:
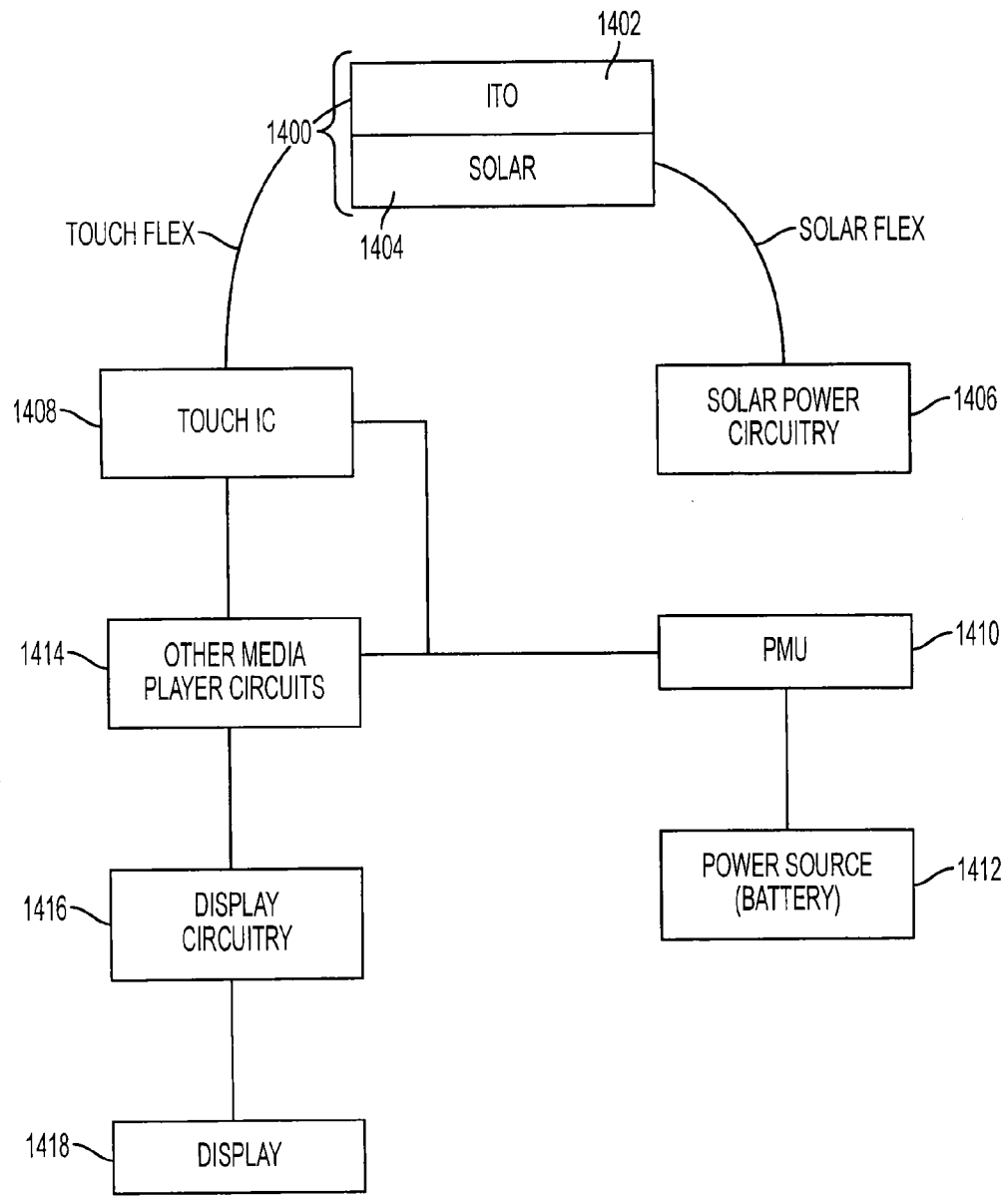
FIG. 14 is an exemplary block diagram illustrating various functional modules of a media player using a combination of touch sensing and solar cells.

FIG. 14 is an exemplary block diagram showing the various functional modules of a media player including an integrated touch sensor array and solar cell stack-up 1400. Integrated touch sensor array and solar cell stack-up includes an ITO touch sensor portion 1402 and a solar panel portion 1404. The solar panel portion 1404 is electrically connected to solar power circuitry 1402, which modulates the power produced by solar panel portion 1404. The solar power circuitry 1402, delivers power from the solar cell panel portion 1404 to power management unit (PMU) 1410. PMU 1410 determines whether to utilize some or all of the power generated by solar panel portion 1404 to recharge power source 1412 or to power media player circuitry 1414 and touch sensor controller 1408. For example, when the media player is off, PMU 1410 may direct all the power to recharge power source 1412. When the media player is in use, PMU 1410 may direct all or some of the power to media player circuitry 1414 and touch sensor controller 1408.

Touch sensor portion 1402 is electrically connected to touch sensor controller 1408. Touch sensor controller 1408 is connected to media player circuitry 1414, which plays one or more media items based on control signals from touch sensor controller 1414. If the media player includes a display, media player circuitry 1414 may be connected to display circuitry 1416, which connects to display 1418 for displaying video content.

FIG. 15a illustrates an exemplary handheld media player including an integrated touch sensor solar cell panel surface 1504 that substantially fills the front surface 1502 of the housing of media player 1500. The handheld media player in FIG. 15b includes a small LED panel 1506, which indicates the mode of the media player. The handheld media player in FIG. 15c includes icons 1508 on the cover glass of integrated touch sensor solar cell panel surface 1504. Icons 1508 indicate where on the surface a user may press to control the media player. Icons 1508, may for example be embossed, etched, or glued onto the surface of the solar cell 1504.

FIG. 16 illustrates an exemplary handheld media player that includes an integrated touch sensor solar cell panel surface 1602 and an integrated touch sensor LCD display surface 1604 on a front surface 1600 of the media player. FIG. 17 illustrates an exemplary handheld media player that includes an integrated touch sensor solar cell panel surface 1702 and a LCD display surface 1704 on a front surface 1700 of the media player.

Figure 18:
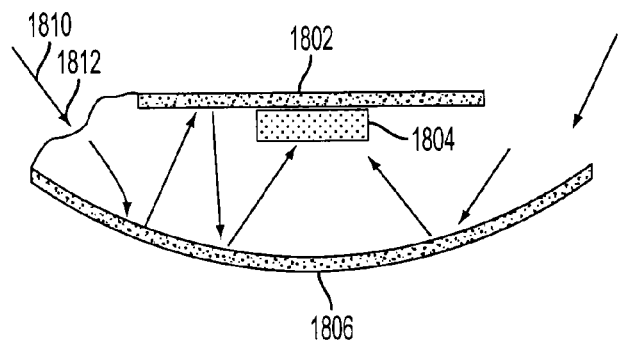
FIG. 18 illustrates an exemplary touch sensor array with a solar cell panel mounted face down behind the touch sensor array and, toward a parabolic reflector.

FIG. 18 illustrates an exemplary touch sensor array 1802 with a solar cell panel 1804 mounted face down behind the touch sensor array and toward a parabolic reflector 1806. This configuration allows the solar panel 1804 to absorb light 1810 that comes into the device around the touch sensor array 1802. Light may enter the device through light channels 1812 on a surface of the device. The back surface of touch sensor array 1802 may be reflective in order to direct back toward parabolic reflector 1806. This configuration allows the solar cell panel 1804 to be mounted behind or integrated with one or more components that may absorb light such as an LCD screen. Light piping such as fiber optics or a mirror assembly may alternatively be used to direct light to the solar panel within the device and around the LCD screen or other component.

Figure 19:
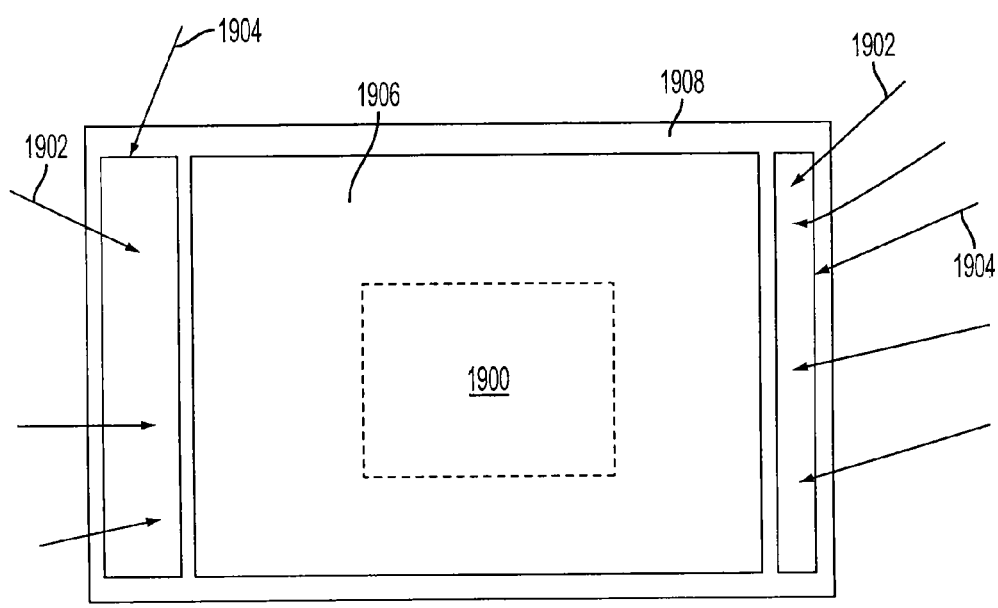
FIG. 19 illustrates an exemplary handheld device including a face down solar cell mounted behind a touch screen.

FIG. 19 illustrates an exemplary handheld media player including a face down solar cell panel 1900 mounted behind a touch screen 1906. The device in FIG. 19 includes a front face 1908 including light channels 1904 that allow light 1902 to enter into the device behind touch screen 1906.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A portable electronic device comprising:
 a housing;
 a touch sensor array configured to detect a touch event on a front surface of the housing;
 a solar panel, wherein a light receiving surface of the solar panel faces away from the touch sensor array; and
 a light channel outside at least a portion of the touch sensor array configured to allow light in an area located outside of the touch sensor array into the housing and direct light around the touch sensor array and to the solar panel.

2. The portable electronic device of claim 1, further comprising a display.

3. The portable electronic device of claim 1, further comprising a touch screen.

4. The portable electronic device of claim 1, wherein the light channel comprises a parabolic reflector.

5. The portable electronic device of claim 1, wherein the light channel comprises fiber optics or a mirror.

6. A method for integrating a solar panel in a portable electronic device comprising:
 configuring a light receiving surface of the solar panel to face away from a touch sensor array of the portable electronic device; and
 forming a light channel outside at least a portion of the touch sensor array configured to allow light in an area located outside of the touch sensor array into the portable electronic device and direct light around at least one partially light-absorbing component and to the solar panel.

7. The method of claim 6, wherein at least one partially light-absorbing component comprises a touch sensor array.

8. The method of claim 6, wherein the partially light-absorbing component comprises a display.

9. The method of claim 6, wherein the light channel comprises a parabolic reflector.

10. The method of claim 6, wherein the light channel comprises fiber optics or a mirror.

* * * * *